United States Patent
Jonnalagadda et al.

(10) Patent No.: US 6,758,909 B2
(45) Date of Patent: Jul. 6, 2004

(54) GAS PORT SEALING FOR CVD/CVI FURNACE HEARTH PLATES

(75) Inventors: Rajanikant Jonnalagadda, Granger, IN (US); Brian J. Miller, Mishawaka, IN (US)

(73) Assignee: Honeywell International Inc., Morristown, NJ (US)

(*) Notice: Subject to any disclaimer, the term of this patent is extended or adjusted under 35 U.S.C. 154(b) by 319 days.

(21) Appl. No.: 09/874,653

(22) Filed: Jun. 5, 2001

(65) Prior Publication Data

US 2002/0179011 A1 Dec. 5, 2002

(51) Int. Cl.[7] .............................................. C23C 16/00
(52) U.S. Cl. ...................... 118/715; 118/724; 118/725; 118/728
(58) Field of Search ................................ 118/715, 724, 118/725, 728

(56) References Cited

U.S. PATENT DOCUMENTS

| | | | |
|---|---|---|---|
| 5,359,148 A | 10/1994 | Okase et al. ................. 118/724 |
| 5,368,648 A | 11/1994 | Sekizuka ..................... 118/733 |
| 5,480,678 A | 1/1996 | Rudolph et al. ........... 427/248.1 |
| 5,562,947 A | 10/1996 | White et al. ............... 427/255.5 |
| 5,746,834 A | * 5/1998 | Hanley ........................ 118/715 |
| 5,746,875 A | 5/1998 | Maydan et al. .............. 156/345 |
| 5,846,330 A | 12/1998 | Quirk et al. ........... 118/723 DC |
| 5,851,294 A | * 12/1998 | Young et al. ................ 118/715 |
| 5,853,485 A | * 12/1998 | Rudolph et al. ............. 118/715 |
| 5,879,458 A | * 3/1999 | Roberson et al. ............ 118/715 |
| 5,885,316 A | * 3/1999 | Sato et al. ..................... 65/324 |
| 5,885,358 A | * 3/1999 | Maydan et al. .......... 118/723 R |
| 5,900,297 A | * 5/1999 | Rudolph et al. ............. 428/66.2 |
| 5,902,406 A | 5/1999 | Uchiyama et al. .......... 118/724 |
| 5,916,633 A | * 6/1999 | Lackey et al. ............. 427/249.3 |
| 6,062,851 A | 5/2000 | Rudolph et al. ............. 432/250 |
| 6,109,209 A | * 8/2000 | Rudolph et al. ............. 118/724 |
| 6,143,078 A | * 11/2000 | Ishikawa et al. ............. 118/715 |
| 6,162,298 A | * 12/2000 | Rudolph ...................... 118/715 |
| 6,230,651 B1 | * 5/2001 | Ni et al. .................... 118/723 I |
| 6,257,881 B1 | * 7/2001 | Fiala et al. .................. 432/250 |
| 6,383,298 B1 | * 5/2002 | Ross et al. ................... 118/712 |
| 6,440,220 B1 | * 8/2002 | Rudolph ............... 118/723 AN |
| 6,572,371 B1 | * 6/2003 | Sion et al. ................... 432/247 |
| 6,576,913 B2 | * 6/2003 | Koyama ................. 250/492.21 |
| 6,669,988 B2 | * 12/2003 | Daws et al. ............. 427/249.2 |
| 2002/0059904 A1 | 5/2002 | Doppelhammer ........... 118/715 |
| 2003/0035893 A1 | * 2/2003 | Daws et al. ............. 427/255.28 |
| 2003/0118728 A1 | * 6/2003 | Sion et al. ............... 427/249.2 |
| 2004/0047990 A1 | * 3/2004 | Daws et al. .............. 427/248.1 |

FOREIGN PATENT DOCUMENTS

| | | |
|---|---|---|
| EP | 0 768 702 A1 | 4/1997 |
| EP | 0 997 553 A1 | 5/2000 |
| EP | 0 995 814 A2 | 4/2002 |
| JP | 62-155511 * | 7/1987 |

OTHER PUBLICATIONS

Webster's Third New International Dictionary of the English Language Unabridged, Merriam–Webster Inc, 1993, p. 444.*

* cited by examiner

Primary Examiner—Jeffrie R. Lund
(74) Attorney, Agent, or Firm—Larry J. Palguta

(57) ABSTRACT

A method and apparatus for sealing gas ports in CVD/CVI furnaces and processes is disclosed. A fluid direction nozzle (160) is positioned between a top lip (101) of a gas inlet port (100) delivering a reactant gas (G) to a furnace compartment (200) in a CVD/CVI furnace (10) and corresponding holes (151) of a CVD/CVI process apparatus such as a hearth plate (150). The fluid direction nozzle 160 reduces leakage of reactant gases (G) and ensures a smooth transition of gas flow direction between the gas inlet port (100) and the corresponding holes (151). CVD/CVI process times are significantly reduced with the use of the reusable/replaceable flow direction nozzles (160).

19 Claims, 5 Drawing Sheets

GAS PORT SEALING FOR CVD/CVI FURNACE HEARTH PLATES

TECHNICAL FIELD AND INDUSTRIAL APPLICABILITY OF THE INVENTION

The present invention is generally directed to Chemical Vapor Deposition/Infiltration (CVD/CVI) apparatus and processes, and more particularly to a method and apparatus utilizing a flow direction nozzle in a CVD/CVI furnace for improving CVD/CVI process time and reducing gas leakage.

BACKGROUND OF THE INVENTION

Chemical vapor deposition and infiltration (CVD/CVI) is a well-known process for depositing a binding matrix within a porous structure. The term "chemical vapor deposition" (CVD) generally implies deposition of a surface coating, but the term is also used to refer to infiltration and deposition of a matrix within a porous structure. The term CVD/CVI is intended to refer to infiltration and deposition of a matrix within a porous structure.

CVD/CVI is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components. The generally known CVD/CVI processes may be classified into four general categories: isothermal, thermal gradient, pressure gradient, and pulsed flow. The specific process times and steps, reactant gas and CVD/CVI furnaces and associated apparatus may vary depending on which of these four general categories is utilized.

U.S. Pat. No. 6,162,298 and corresponding European Patent Application EP 0 997 553 A1 to Rudolph describe these and other CVD/CVI processes and apparatus in further detail. Rudolph particularly describes a sealed reactant gas inlet for a CVD/CVI furnace.

FIG. 1 is a side cross-sectional view of a furnace according to U.S. Pat. No. 6,162,298. A generally cylindrical furnace 10 configured to be employed with a high temperature process is shown. The furnace includes a steel shell 12 and a steel lid 14. The shell 12 includes a flange 16 and the lid 14 includes a mating flange 18 that seals against flange 16 when the lid 14 is installed upon the shell 12, as shown in FIG. 1. The lid also includes a vacuum port 20.

The shell 12 and lid 14 together define a furnace volume 22 that is reduced to vacuum pressure by a steam vacuum generator (not shown) in fluid communication with the vacuum port 20. The shell 12 rests upon a multitude of legs 62. The furnace 10 also includes a cylindrical induction coil 24 adjacent a cylindrical susceptor 26. The induction coil 24 includes coiled conductors 23 encapsulated by electrical insulation 27.

During operation, the induction coil 24 develops an electromagnetic field that couples with the susceptor 26 and generates heat within the susceptor 26. The induction coil 24 may be cooled, typically by integral water passages 25 within the coil 24. The susceptor 26 rests upon a susceptor floor 28 and is covered by a susceptor lid 30. A cylindrical insulation wall 32 is disposed in between the susceptor 26 and the induction coil 24. A lid insulation layer 34 and a floor insulation layer 36 are disposed over the susceptor lid 30 and beneath the susceptor floor 28, respectively.

The susceptor floor 28 rests upon the insulation layer 36, which, in turn, rests upon a furnace floor 38. The furnace floor 38 is attached to the shell 12 by a floor support structure 40 that includes a multitude of vertical web structures 42.

A reactant gas is supplied to the furnace 10 by a main gas supply line 44. A plurality of individual gas supply lines 46 are connected in fluid communication with a plurality of gas ports 48 that pass through the furnace shell 12. A plurality of flexible gas supply lines 50 are connected in fluid communication with the gas ports 48 and a multitude of gas inlets 52 that pass through holes 54 in the furnace floor 38, the floor insulation layer 36, and the susceptor floor 28.

U.S. Pat. No. 6,162,298 further describes a gas preheater 56 resting on the susceptor floor 28 and including a multitude of stacked perforated plates 58 that are spaced from other by a spacing structure 60. Each plate 58 is provided with an array of perforations that are horizontally shifted from the array of perforations of the adjacent plate 58. This causes the reactant gas to pass back and forth through the plates, which diffuses the reactant gas within the preheater 56 and increases convective heat transfer to the gas from the perforated plates 58. A multitude of porous substrates 62, for example brake disks, are stacked within the furnace 10 inside the susceptor 26 on fixtures (not shown).

Further, U.S. Pat. No. 6,162,298 is directed toward preventing gas leakage around the gas inlet 52 extending through the hole 54 in the susceptor floor 28 in the CVD/CVI furnace 10. The method and apparatus seal the gas inlet 52 to the susceptor floor 28 with sufficient intimacy to block leakage of gas through the hole 54 around the gas inlet 52 while allowing the gas inlet 52 to cyclically translate through the hole 54, as indicated by arrow 55, due to thermal expansion and contraction induced by thermal cycles in the CVD/CVI furnace 10.

Reactant gas entry through the gas inlets 52 is diffused within the preheater 56 and eventually reaches the porous substrates 62. However, reactant gas leaving the gas inlets 52 follows a tortuous path as it travels back and forth through the plates 58.

SUMMARY OF THE PRESENT INVENTION

The present invention overcomes the shortcomings associated with the background art and achieves other advantages not realized by the background art.

The present invention, in part, is a recognition that current CVD/CVI process time is lengthy and results in considerable expense. The present invention provides a CVD/CVI method and apparatus that reduces process time, ensures efficient use of reactant gases, and permits an increase in process output.

The present invention, in part, is a recognition that reactant gas, such as densification gas, delivered directly to target carbon parts, will greatly improve process time.

The present invention, in part, provides a gas inlet port assembly for a CVD/CVI furnace having a furnace compartment and a CVD/CVI process apparatus with a plurality of holes, the gas inlet port assembly comprising a plurality of gas inlet ports delivering process gas to the furnace compartment; and a plurality of flow direction nozzles positioned between the holes of the CVD/CVI process apparatus and the gas inlet ports.

The present invention, also in part, provides a flow direction nozzle assembly for a CVD/CVI furnace, the flow direction nozzle assembly comprising a flow direction nozzle including a gas inlet port sealing portion; a support shoulder; and a nozzle portion.

The present invention, also in part, provides a method for sealing gas inlet ports for delivering a process gas in a CVD/CVI furnace, the method comprising positioning flow direction nozzles along upper lips of the gas inlet ports; loading a CVD/CVI process apparatus having a plurality of gas inlet holes into the furnace; sealingly engaging the flow direction nozzles to the gas inlet holes of the process apparatus to create a gas path-directing, fluid seal.

Advantages of the present invention will become more apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus do not limit the present invention.

DETAILED DESCRIPTION OF THE PREFERRED EMBODIMENTS

The present invention will now be described in detail with reference to the accompanying drawings.

Figure 2:
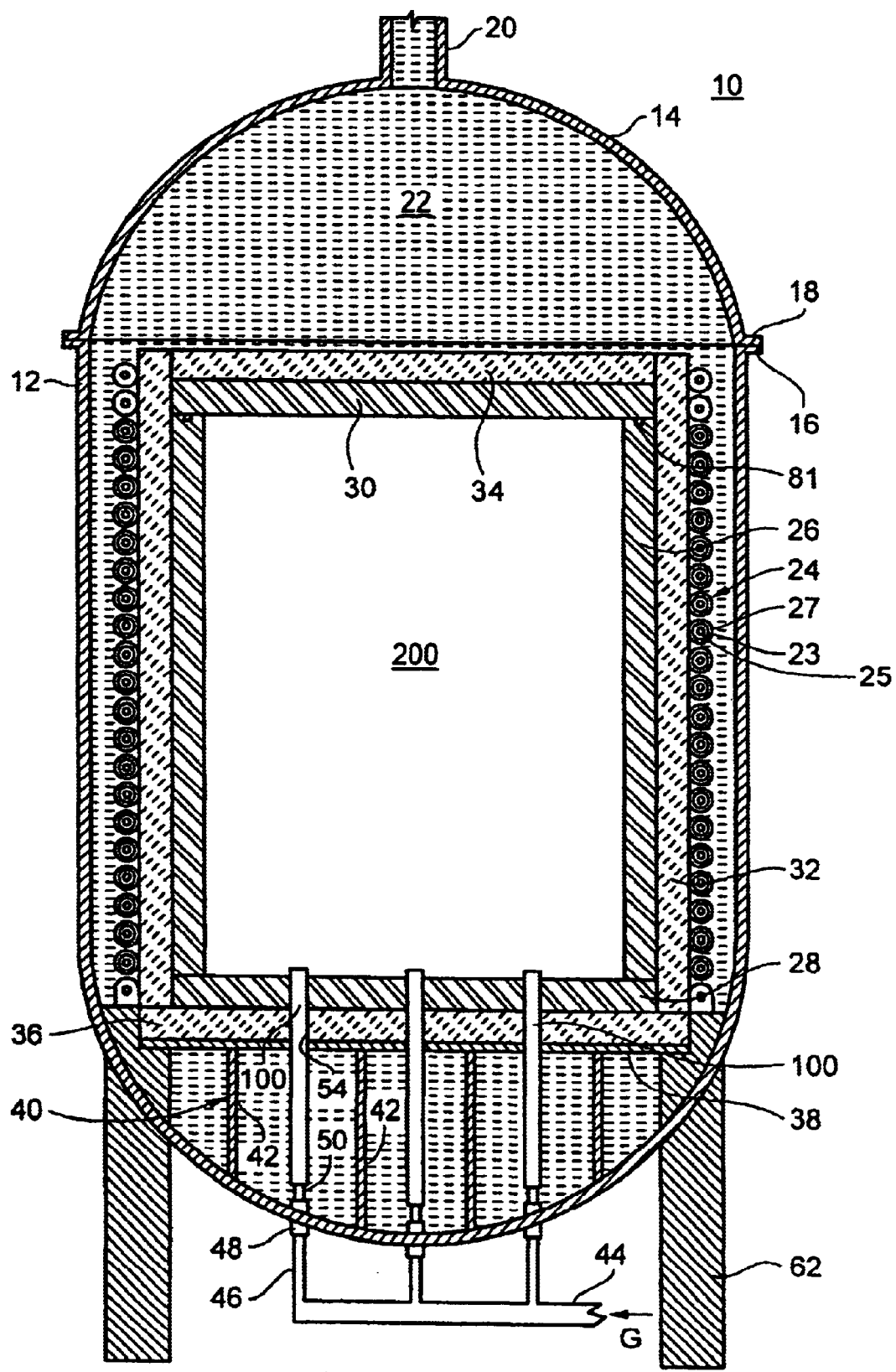
FIG. 2 is a side cross-sectional view of a furnace incorporating an embodiment of the present invention.
Figure 3:
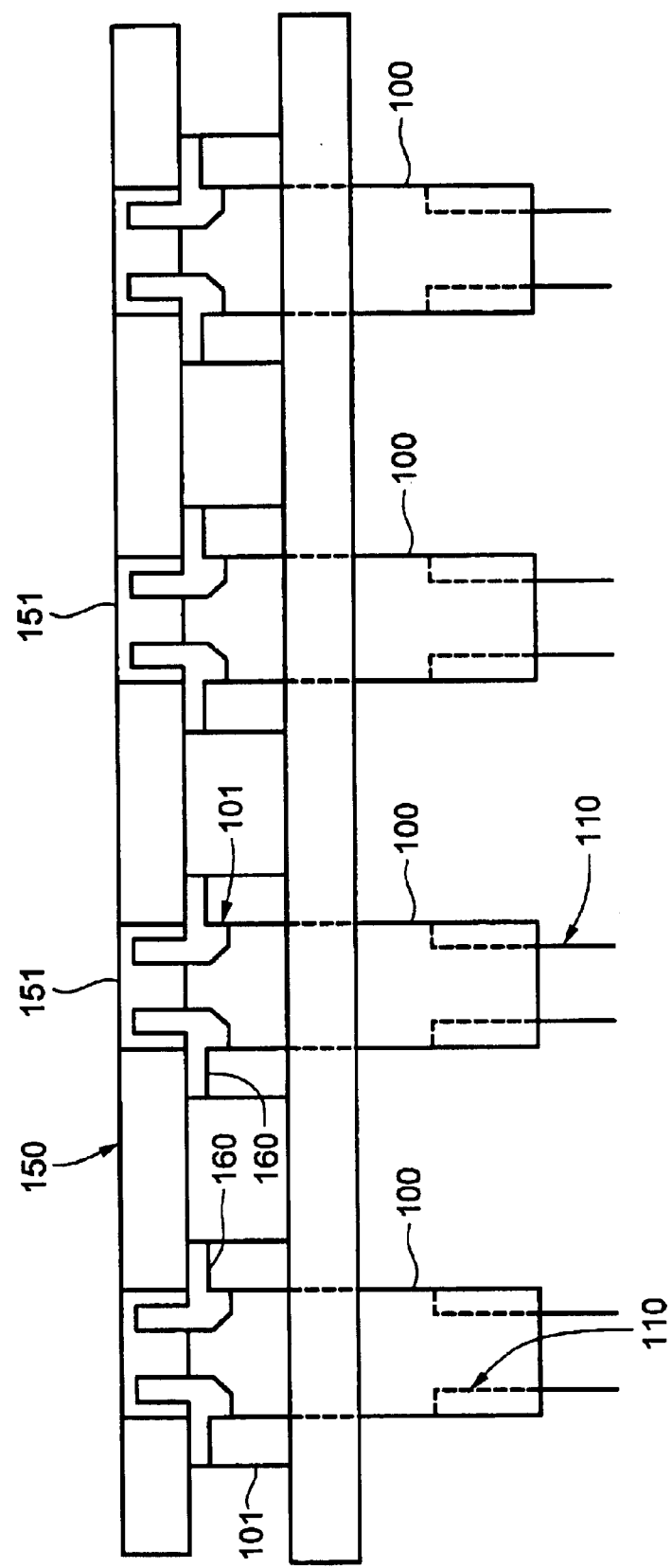
FIG. 3 is an enlarged, side cross-sectional view of hearth plate and flow direction nozzle assemblies according to an embodiment of the present invention.
Figure 4:
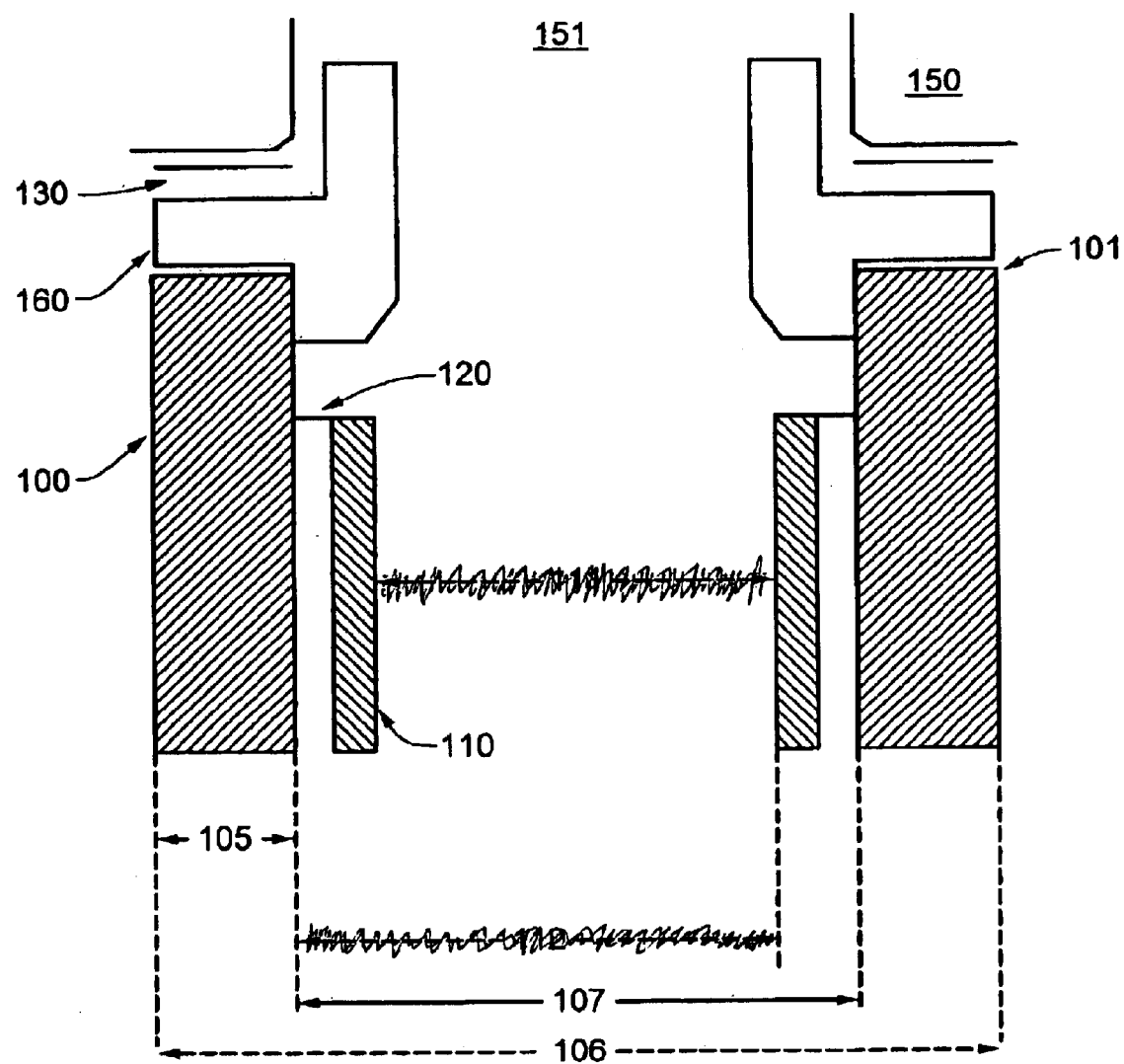
FIG. 4 is an enlarged, side cross-sectional view of a flow direction nozzle assembly and gas inlet port according to an embodiment of the present invention.
Figure 5:
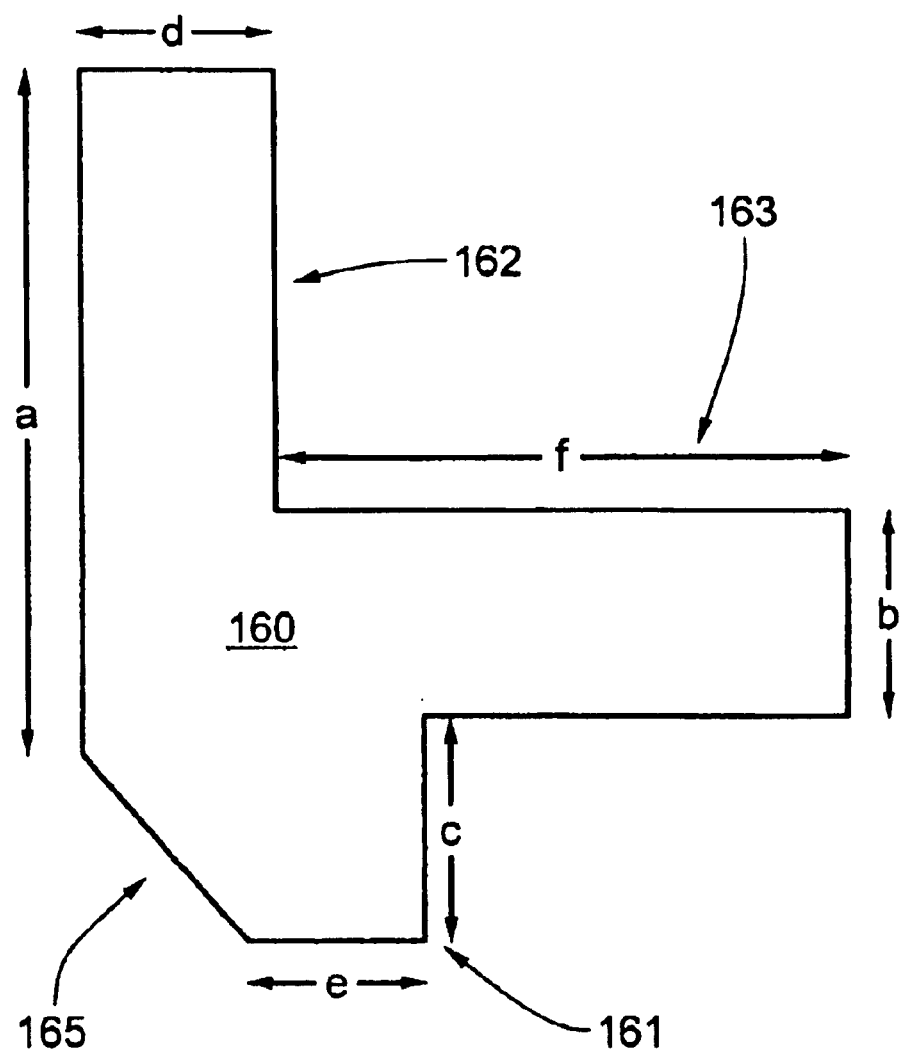
FIG. 5 is a side, partial cross sectional view of a flow direction nozzle according to an embodiment of the present invention.

FIG. 2 is a side cross-sectional view of a furnace incorporating an embodiment of the present invention. FIG. 3 is an enlarged, side cross-sectional view of the hearth plate and flow direction nozzle assemblies according to an embodiment of the present invention, currently provided for resistively heated furnaces. However, the present invention is similarly applicable to inductively heated furnaces. FIG. 4 is an enlarged, side cross-sectional view of a flow direction nozzle assembly and gas inlet port according to an embodiment of the present invention. FIG. 5 is a side, partial cross sectional view of a flow direction nozzle according to an embodiment of the present invention.

FIG. 2 is a side cross-sectional view of an exemplary furnace incorporating an embodiment of the present invention. One of skill in the art will appreciate that the actual furnace construction and CVD/CVI processes implemented will vary according to the products undergoing treatment within the furnace compartment 200. Accordingly, the CVD/CVI furnace 10 shown in FIG. 2 simply indicates one type of application of the present invention.

Figure 1:
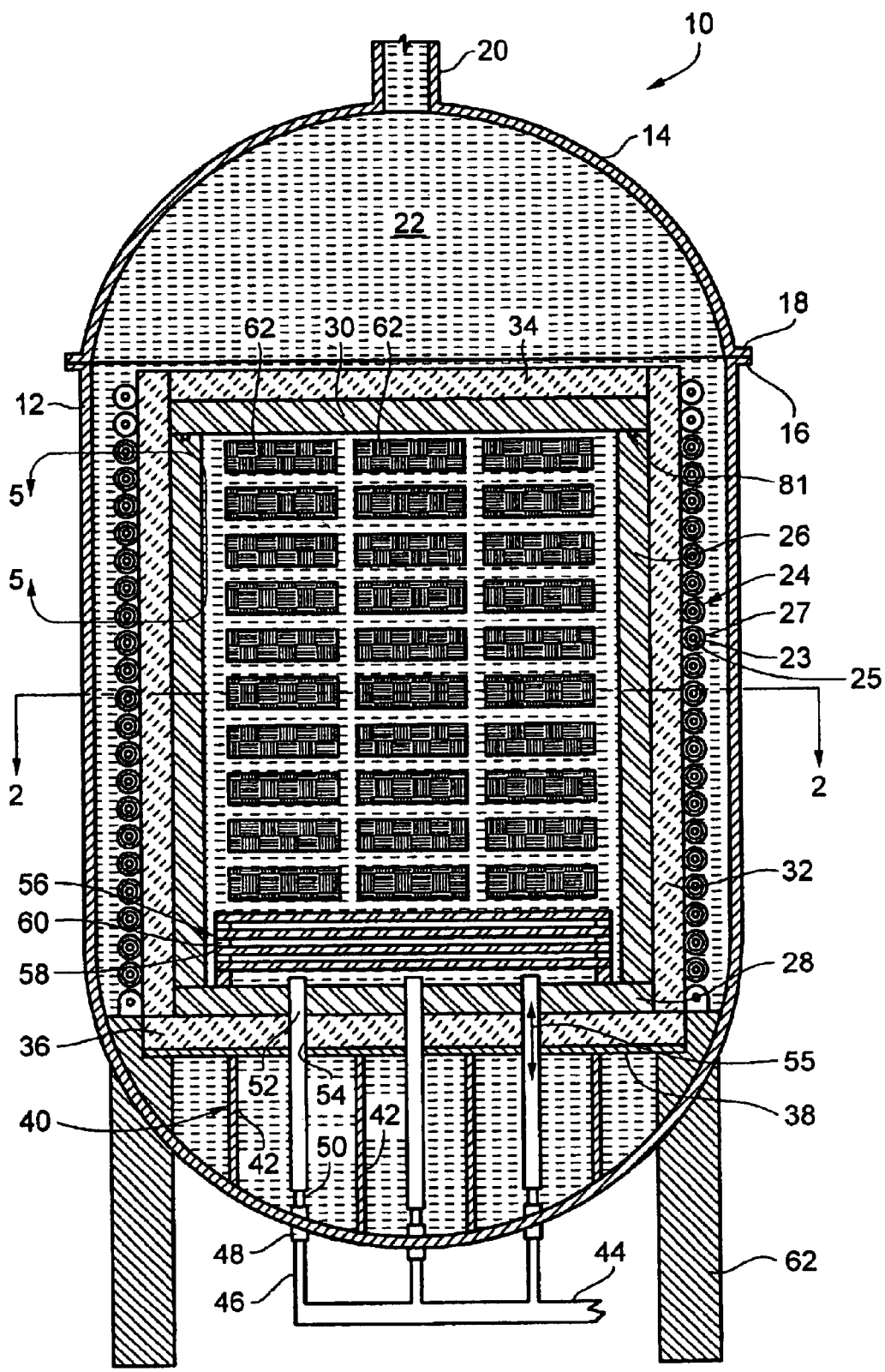
FIG. 1 is a side cross-sectional view of a furnace according to the background art.

A generally cylindrical furnace 10 configured to be employed in a densification process for carbon fiber based brakes is shown in FIG. 2. The furnace includes a steel shell 12 and a steel lid 14. The shell 12 includes a flange 16 and the lid 14 includes a mating flange 18 that seals against flange 16 when the lid 14 is installed upon the shell 12, as shown in FIG. 1. The lid may also include a vacuum port 20.

The shell 12 and lid 14 together define a furnace volume 22 that may be reduced to vacuum pressure by a steam vacuum generator (not shown) in fluid communication with the vacuum port 20. The shell 12 rests upon a multitude of legs 62. The furnace 10 may also be provided with a cylindrical induction coil 24 adjacent a cylindrical susceptor 26. The induction coil 24 includes coiled conductors 23 encapsulated by electrical insulation 27. However, induction cooling is not necessary in a preferred embodiment of the present invention.

During operation, the induction coil 24 develops an electromagnetic field that couples with the susceptor 26 and generates heat within the susceptor 26. The induction coil 24 may be cooled, typically by integral water passages 25 within the coil 24. The susceptor 26 rests upon a susceptor floor 28 and is covered by a susceptor lid 30.

A cylindrical insulation wall 32 is disposed in between the susceptor 26 and the induction coil 24. A lid insulation layer 34 and a floor insulation layer 36 are disposed over the susceptor lid 30 and beneath the susceptor floor 28, respectively. The susceptor floor 28 rests upon the insulation layer 36, which, in turn, rests upon a furnace floor 38. The furnace floor 38 is attached to the shell 12 by a floor support structure 40 that includes a multitude of vertical web structures 42.

As seen in FIG. 2, a reactant gas G is supplied to the furnace 10 by a main gas supply line 44. A plurality of individual gas supply lines 46 are connected in fluid communication with a plurality of gas ports 48 that pass through the furnace shell 12. A plurality of flexible gas supply lines 50 are connected in fluid communication with the gas ports 48 and a multitude of gas inlet ports 100 that pass through holes 54 in the furnace floor 38, the floor insulation layer 36, and the susceptor floor 28.

When the aforementioned CVD/CVI furnace 10 is used for densifying fiber-based brakes, the carbon parts are first stacked on a hearth plate 150. The hearth plate 150 is then loaded into the furnace 10. The gas G that is intended to densify the carbon parts enters the furnace compartment 200 through the gas inlet ports 100.

Prior to the present invention, the reactant gas G would eventually travel through holes formed in the bottom of the hearth plate 150, or whatever mating apparatus is otherwise loaded within the furnace compartment 200. However, the CVD/CVI processes, particularly CVD processes, are often time-consuming processes. Accordingly, it is important that all of the gas G that is fed to the furnace compartment 200 reaches the parts for densification directly.

FIG. 3 is an enlarged, side cross-sectional view of hearth plate and flow direction nozzle assemblies according to an embodiment of the present invention. As seen in FIG. 3, a hearth plate 150 having a plurality of holes 151 is arranged above the furnace floor 38 and gas inlet ports 100.

The gas G exiting the gas inlet ports 100 would eventually flow to the adjacent holes 151 of the hearth plate in conventional applications of the background art. However, the present inventors have found that this lack of complete sealing between gas inlet port top lips 101 and the hearth plate bottom holes 151 in these conventional applications can be prevented by the present invention.

Accordingly, a plurality of flow direction nozzles 160 are employed in positions between the gas inlet port top lips 101 and the hearth plate holes 151. These flow direction nozzles 160 perform both a sealing function and a fluid directing function. The flow direction nozzles 160 produce a direct flow alignment between the gas inlet port 100 and the corresponding inlet holes 151 of the mating apparatus.

The flow direction nozzles 160 prevent the gas G from leaking and becoming misdirected away from the corresponding holes 151 of the hearth plate 150 (or other apparatus placed within the furnace compartment 200). The flow direction nozzles 160 thereby improve process times and a smooth transition of gas direction from the gas inlet ports 100 to the hearth plate/apparatus holes 151. Accordingly, all of the process/reactant gas G is directed toward the holes 151 of the hearth plate 150 and the carbon parts positioned thereon.

FIG. 4 is an enlarged, side cross-sectional view of a flow direction nozzle assembly and gas inlet port according to an embodiment of the present invention. FIG. 4 shows a single hearth plate hole 151 sealingly engaged with a gas inlet port upper lip 101 of a corresponding gas inlet port 100. A flow direction nozzle 160 is provided between the gas inlet port 100 and the hearth plate hole 150.

A GRAFOIL® brand of sealing disc 130 is provided between the flow direction nozzle 160 and the hearth plate 150 (or other mating apparatus) on an outlet side of the flow direction nozzle 160. A ceramic protection tube material 110, such as a mullite tube, may be provided along an interior of the gas inlet port 100, the interior defined by the region located within the internal diameter 107 of the gas inlet port 100. An additional GRAFOIL® sealing disc 120 may be incorporated between an upper edge of the ceramic protection tube material 110 and the internal diameter 107 of the gas inlet port 100 on an inlet side of the flow direction nozzle 160.

In a preferred embodiment, the flow direction nozzles 160 are essentially annular shaped collars that can molded, cast or machined. Although one of skill in the art will appreciate that there are several suitable materials for the flow direction nozzles 160 and the potentially high temperature, pressure and severe operating environment of CVD/CVI processes, a preferred embodiment includes nozzles 160 constructed of graphite. One of skill in the art will further appreciate that graphite includes and is not limited to molded graphite, crystalline graphite, recrystallized graphite, graphite fiber-reinforced graphite composites and graphite-graphite composites.

As aforementioned, GRAFOIL® brand of flexible graphite, is desirable for its superior sealing ability particular with respect to fluids/gases, ability to withstand severe temperature and pressure environments, corrosion resistance, easy removal and installation, and resiliency. The Grafoil® sealing discs 120, 130 are used to compensate for dimensional distortion between the apparatus' bottom surface, e.g. hearth plate 150 and the flow direction nozzle 160. In an exemplary embodiment, the sealing discs 120, 130 are annular sealing discs or rings.

Further, mullite, utilized in a tube 110 of an embodiment of the present invention, is particularly advantageous due to its common use as a refractory material for firebrick and furnace linings, flame resistance, low, uniform coefficient of thermal expansion, and heat conductivity. However, one of skill in the art will appreciate that alternative materials can be incorporated into the present invention, particularly those showing common properties with those specifically listed in the foregoing embodiments.

FIG. 5 is a side, partial cross sectional view of a flow direction nozzle according to an embodiment of the present invention. As seen in FIG. 4 and FIG. 5, the annular flow direction nozzle 160 is designed to fit into the gas inlet port 100. The flow direction nozzle 160 includes a gas inlet port sealing portion 161 matingly engaging the corresponding internal diameter 107 of the gas inlet port 100 and defining an inlet region of the flow direction nozzle 160. The gas inlet port sealing portion 161 ensures admission of gas G into an interior of the flow direction nozzle 160. The flow direction nozzle also include a machined support shoulder 163 resting on the gas inlet port top lip 101. The machined support shoulder 163 designed to support a corresponding lower surface of an apparatus being loaded above the gas inlet ports 100, such as the hearth plate 150. A nozzle portion 162 of the flow direction nozzle 160 extends into the apparatus being loaded, e.g. hearth plate hole 151.

As seen in FIG. 4 and FIG. 5, the flow direction nozzle 160 and hearth plate holes 151 can also be provided with chamfered surfaces. A chamfered surface 165 of the flow direction nozzle 160 additionally provides smooth, fluid flow. The hearth plate 150 or other apparatus being loaded into the furnace compartment 200 is supported by the flow direction nozzles 160.

In an exemplary embodiment, the gas inlet ports 100 can be cut to a length of approximately 3.5 inches. A gas inlet port outer diameter 106 can be approximately 1 inch larger, e.g. have a tube thickness 105 of 1 inch. As seen in FIG. 5, the flow direction nozzle 160 may have vertical dimensions of approximately a=1.50 to 2.00 inches, b=0.50 inches, and c=0.50 inches. Approximate horizontal dimensions of the flow direction nozzle 160 may include d=0.50 inches, e=0.00 to 0.75 inches, and f=1.25 inches. However, one of ordinary skill in the art will appreciate that these values will be routinely modified to suit the particular size of mating components such as varying gas inlet port size and varying hearth plate hole diameters. Further, although relative sizes have been depicted in the accompanying drawings, one of skill in the art will appreciate that FIG. 1 through FIG. 5 are not necessarily drawn to scale.

A method according to the present invention will now be described with reference to the accompanying drawings and foregoing description of FIGS. 2–5. The present invention is directed toward a method of providing a fluid seal between a gas inlet port and a CVD/CVI process apparatus, such as a hearth plate 150. The method includes positioning flow direction nozzles 160 along each gas inlet port top lip 101 of a plurality of gas inlet ports 100.

A CVD/CVI process apparatus to be loaded within a furnace compartment 200, such as a hearth plate 150, is then positioned above the flow direction nozzles 160. Corresponding process apparatus holes, such as hearth plate holes 151, are sealingly engaged with the flow direction nozzles 160 to create a fluid/gas seal. Accordingly, reactant gas G is prevented from being misdirected away from corresponding process apparatus holes and from leaking away from the targeted, CVD/CVI process apparatus. The flow direction nozzles 160 can be reused and easily replaced as they become worn, damaged or lost.

Further examples of suitable materials, CVD/CVI process steps and apparatus, and potential applications of the present invention are described in U.S. Pat. No. 6,162,298 to Rudolph; the entirety of which is hereby incorporated by reference. Further, one of skill in the art will appreciate that the specific furnace and fixture configurations listed in the foregoing description are merely exemplary of some of the many applications of the present invention.

Accordingly, the type of CVD/CVI processes and furnaces employed may vary substantially depending upon the targeted products, e.g. aircraft brakes, internal combustion engine components, gas or steam turbine parts, etc . . . As such, the furnace configuration of FIG. 2 is presented by way of example, and is not intended to limit the invention to the specific arrangement presented. Further, although an annular flow direction nozzle 160 has been described, one of skill in the art will appreciate that the geometry of the flow direction nozzle can be varied to effect changes in pressure, flow path, and/or gas velocity, particularly with respect to well known characteristics of affecting nozzle/venturi flow paths.

What is claimed is:

1. A gas inlet port assembly for a CVD/CVI furnace having a furnace compartment and a CVD/CVI process apparatus with a plurality of holes, said gas inlet port assembly comprising:

a plurality of gas inlet ports delivering process gas to said furnace compartment; and a plurality of flow direction nozzles positioned between said holes of said CVD/CVI process apparatus and said gas inlet ports.

2. The gas inlet port assembly according to claim 1, further comprising:

a gas inlet port upper lip respectively provided on each of said gas inlet ports; and a pair of annular sealing discs respectively provided for each of said flow direction nozzles, said flow direction nozzles sealingly engaging said gas inlet port upper lip with a corresponding hole of said CVD/CVI process apparatus.

3. The gas inlet port assembly according to claim 2, wherein a first sealing disc of said pair of annular sealing discs is positioned adjacent to an outlet side of each flow direction nozzle and a second sealing disc is positioned adjacent to an inlet side of said flow direction nozzle.

4. The gas inlet port assembly according to claim 3, wherein said sealing discs are flexible graphite sealing discs.

5. The gas inlet port assembly according to claim 1, wherein said holes are located in a hearth plate of said CVD/CVI process apparatus, and said holes are chamfered holes formed on a bottom of said hearth plate.

6. The gas inlet port assembly according to claim 1, wherein each of said flow direction nozzles includes:

a gas inlet port sealing portion, said gas inlet port sealing portion extending into said respective gas inlet ports;

a support shoulder; and a nozzle portion.

7. The gas inlet port assembly according to claim 6, wherein said nozzle portion extends into said holes of said CVD/CVI process apparatus.

8. The gas inlet port assembly according to claim 6, wherein said gas inlet ports include a protective ceramic tubing having an upper edge positioned along an interior diameter of said gas inlet ports, said nozzle portion of said respective flow direction nozzles sealingly engaging the upper edge of said protective ceramic tubing.

9. The gas inlet port assembly according to claim 8, wherein said protective ceramic tubing is mullite tubing.

10. The gas inlet port assembly according to claim 1, wherein said flow direction nozzles are made of graphite.

11. A flow direction nozzle assembly for a CVD/CVI furnace, said flow direction nozzle assembly comprising:

a flow direction nozzle, wherein said flow direction nozzle is an annular shaped collar including a gas inlet port sealing portion adjacent to a gas inlet of said collar;

a support shoulder extending in a direction away from said gas inlet of said collar; and a nozzle portion, wherein said gas inlet sealing portion, said nozzle portion and said shoulder portion are formed of an integrally formed, single piece of molded, cast or machined graphite.

12. The flow direction nozzle assembly according to claim 11, wherein said gas inlet port sealing portion surrounds the gas inlet and the nozzle portion surrounds a gas outlet.

13. The flow direction nozzle assembly according to claim 12, further comprising at least one sealing disc.

14. The flow direction nozzle assembly according to claim 13, wherein said at least one sealing disc includes a first sealing disc positioned adjacent to said flow direction nozzle and a second sealing disc positioned adjacent to said gas inlet sealing portion of said flow direction nozzle.

15. The flow direction nozzle assembly according to claim 13, wherein said sealing discs are flexible graphite sealing discs and said flow direction nozzle is made from graphite.

16. The flow direction nozzle assembly according to claim 11, further comprising a chamfered surface along said gas inlet sealing portion.

17. The flow direction nozzle assembly according to claim 16, wherein said support shoulder extends in a direction away from and substantially orthogonal to said nozzle portion of said collar.

18. The flow direction nozzle assembly according to claim 17, further comprising a gas inlet tube, wherein said inlet sealing portion includes a chamfered section surrounding said gas inlet of said collar, and said gas inlet sealing portion is operatively engaged with an outlet of the gas inlet tube.

19. The flow direction nozzle assembly according to claim 16, wherein said gas inlet sealing portion includes a chamfered section surrounding said gas inlet of said collar.

* * * * *